(12) United States Patent
Cho et al.

(10) Patent No.: US 8,369,107 B2
(45) Date of Patent: Feb. 5, 2013

(54) ORGANIC LIGHT EMITTING DIODE DISPLAY AND METHOD FOR MANUFACTURING THE SAME

(75) Inventors: Dai-Han Cho, Yongin (KR); Dong-Su Yee, Yongin (KR); Chan-Kyoung Moon, Yongin (KR); Min-Su Kim, Yongin (KR); Jung-Ho Hwang, Yongin (KR); Hyun-Hee Lee, Yongin (KR); Chan-Hee Wang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 337 days.

(21) Appl. No.: 12/605,469

(22) Filed: Oct. 26, 2009

(65) Prior Publication Data
US 2010/0103641 A1 Apr. 29, 2010

(30) Foreign Application Priority Data
Oct. 27, 2008 (KR) .................. 10-2008-0105335

(51) Int. Cl.
*H02B 1/01* (2006.01)
*H05K 5/00* (2006.01)
*H05K 1/02* (2006.01)
*G02F 1/1333* (2006.01)

(52) U.S. Cl. .............. 361/829; 361/679.01; 361/679.21; 361/679.22; 361/679.23; 361/756; 174/259; 349/58; 349/122

(58) Field of Classification Search .................. 349/58, 349/60, 122; 445/24; 361/696.697, 729, 361/756, 679.01, 679.21–679.23, 829; 174/259
See application file for complete search history.

(56) References Cited

U.S. PATENT DOCUMENTS

| | | | | |
|---|---|---|---|---|
| 5,880,795 A | * | 3/1999 | Nagata et al. | 349/58 |
| 7,027,112 B2 | * | 4/2006 | Wang et al. | 349/58 |
| 2002/0149714 A1 | * | 10/2002 | Anderson et al. | 349/59 |
| 2003/0174260 A1 | * | 9/2003 | Labrousse et al. | 349/58 |
| 2003/0202135 A1 | * | 10/2003 | Ono et al. | 349/63 |
| 2005/0014022 A1 | * | 1/2005 | Park | 428/690 |
| 2005/0110772 A1 | * | 5/2005 | Kong et al. | 345/174 |
| 2005/0151899 A1 | * | 7/2005 | Chou et al. | 349/110 |
| 2005/0285990 A1 | * | 12/2005 | Havelka et al. | 349/58 |
| 2006/0044490 A1 | * | 3/2006 | Ichioka et al. | 349/58 |
| 2006/0119760 A1 | * | 6/2006 | Okuda | 349/58 |
| 2008/0020150 A1 | * | 1/2008 | Kim et al. | 428/1.31 |
| 2008/0158799 A1 | * | 7/2008 | Tai et al. | 361/681 |
| 2008/0238302 A1 | * | 10/2008 | Sung et al. | 313/504 |
| 2008/0297041 A1 | * | 12/2008 | Park | 313/504 |
| 2009/0079904 A1 | * | 3/2009 | Yada et al. | 349/60 |
| 2009/0109366 A1 | * | 4/2009 | Lippey | 349/58 |

FOREIGN PATENT DOCUMENTS
KR 10-0626015 9/2006
KR 10-2007-0059583 6/2007

* cited by examiner

*Primary Examiner* — Timothy J Thompson
*Assistant Examiner* — Sherman Ng
(74) *Attorney, Agent, or Firm* — Robert E. Bushnell, Esq.

(57) ABSTRACT

An OLED display and a manufacturing method thereof. The OLED includes: a cover window; a guide frame disposed on the cover window; an adhesive layer disposed on the cover window, within the guide frame, and a display panel attached to the cover window, via the adhesive layer.

11 Claims, 4 Drawing Sheets

ORGANIC LIGHT EMITTING DIODE DISPLAY AND METHOD FOR MANUFACTURING THE SAME

CROSS-REFERENCE TO RELATED APPLICATION

This application claims the benefit of Korean Patent Application No. 10-2008-0105335, filed on Oct. 27, 2008, in the Korean Intellectual Property Office, the disclosure of which is incorporated herein, by reference.

BACKGROUND OF THE INVENTION

1. Field of the Invention

Aspects of the present invention relate to an organic light emitting diode (OLED) display and a manufacturing method thereof.

2. Description of the Related Art

An organic light emitting diode (OLED) display has self-emission characteristics and is generally thinner and lighter than a liquid crystal display (LCD), since a LCD display includes a separate light source. In addition, OLED displays generally have a low power consumption, a high luminance, and a high reaction speed, and therefore, the are appropriate for use in mobile electronic devices.

In general, an OLED display includes: a display panel having two substrates that are bonded to each other, with OLEDs formed therein; a cover window disposed facing the display panel; and a supporting member (or bezel) to support the display panel and the cover window. In this case, an air gap is formed between the display panel and the cover window. Due to a refractive index difference between the cover window and the air in the air gap, the light transmittance and the image visibility of such an OLED display is decreased.

In addition, since an edge of the display panel is fixed, by being combined to the supporting member or the bezel, the OLED display can be easily damaged by external impacts. Particularly, the supporting member or bezel may be deformed, due to an external impact, and collide with the display panel, of the force of the impact may be transmitted to the display panel, resulting in damage to the display panel. The impact resistance can be improved by omitting the supporting member, but this may result in the assembly efficiency being significantly reduced.

SUMMARY OF THE INVENTION

Aspects of the present invention provide an organic light emitting diode (OLED) display having improved image visibility, impact resistance, and assembly efficiency.

Aspects of the present invention provide a manufacturing method of the OLED display.

An OLED display, according to an exemplary embodiment of the present invention, includes a cover window, a guide frame disposed on the cover window, a display panel disposed within the guide frame, and an adhesive layer to attach the cover window to the display panel.

According to aspects of the present invention, the adhesive layer may be made of a transparent material, and may a space between the cover window and the display panel.

According to aspects of the present invention, the adhesive layer may be coated in liquid phase and then solidified, such that the cover window and the display panel may be combined to each other.

According to aspects of the present invention, the guide frame may include a flange combined to the cover window, and a side wall that extends from the flange and faces the display panel.

According to aspects of the present invention, the OLED display may further include an adhesive member interposed between the flange of the guide frame and the cover window.

According to aspects of the present invention, the side wall may be spaced apart from the display panel.

According to aspects of the present invention, the flange may be disposed between the cover window and the display panel.

According to aspects of the present invention, the flange may extend from the side wall, away from the display panel.

According to aspects of the present invention, the side wall may surround sides of the display panel.

According to aspects of the present invention, the guide frame may be integrally formed with the cover window.

According to aspects of the present invention, the guide frame may be spaced apart from the display panel.

A manufacturing method of an OLED display, according to an exemplary embodiment of the present invention, includes: preparing a cover window; combining a guide frame to one side of the cover window; applying a liquid phase adhesive layer to the cover window; and attaching a display panel to the display window, by solidifying the adhesive layer.

According to aspects of the present invention, the adhesive layer may be made of a transparent material, and may fill in a space between the cover window and the display panel.

According to aspects of the present invention, the guide frame may include a side wall that extends along sides of the display panel, and a flange that extends from the side wall, to attach the guide frame to the cover window.

According to aspects of the present invention, the guide frame and the cover window may be attached to each other, by disposing an adhesive member between the flange of the guide frame and the cover window.

According to aspects of the present invention, the side wall may be spaced apart from the display panel.

According to aspects of the present invention, the visibility, impact resistance, and assembly efficiency of the OLED display can be improved. In addition, the OLED display can be effectively manufactured.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EXEMPLARY EMBODIMENTS

Figure 1:
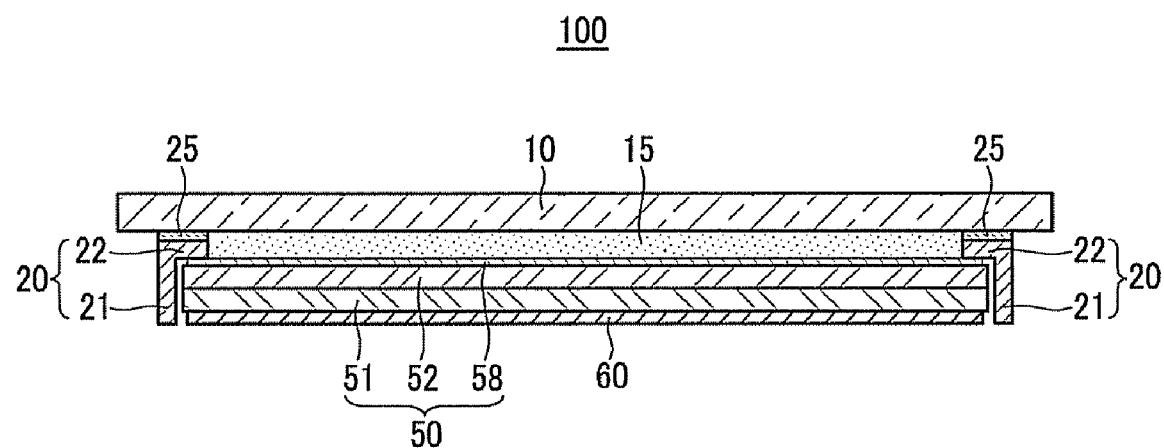
FIG. 1 is a cross-sectional view of an organic light emitting diode (OLED) display, according to a first exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

In the drawings, the thickness of layers, films, panels, regions, etc., are exaggerated for clarity. As referred to herein, when a first element is said to be disposed or formed "on", or "adjacent to", a second element, the first element can directly contact the second element, or can be separated from the second element by one or more other elements located therebetween. In contrast, when an element is referred to as being disposed or formed "directly on" another element, there are no intervening elements present. As used herein, the term "and/or" includes any and all combinations of one or more of the associated listed items.

Figure 2:
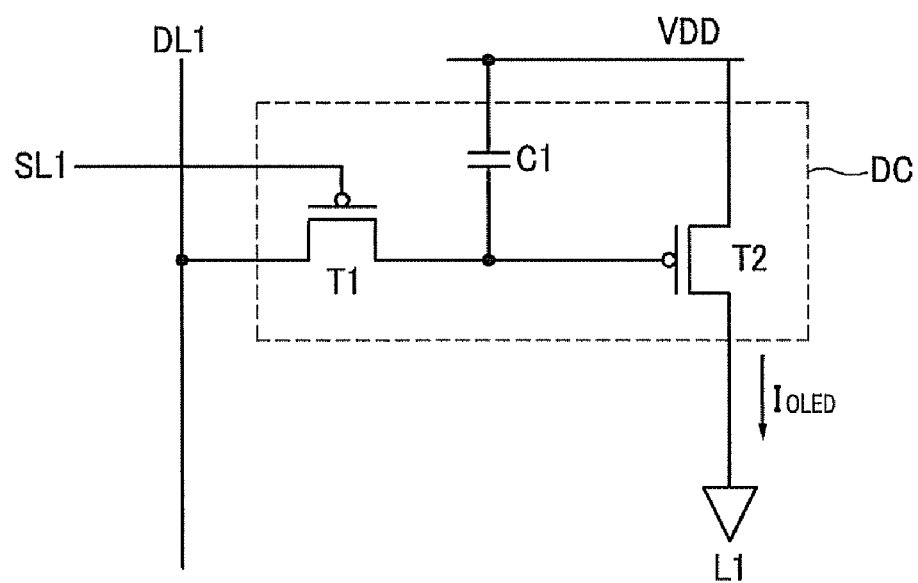
FIG. 2 is a layout view of a pixel circuit of a display panel of FIG. 1.
Figure 3:
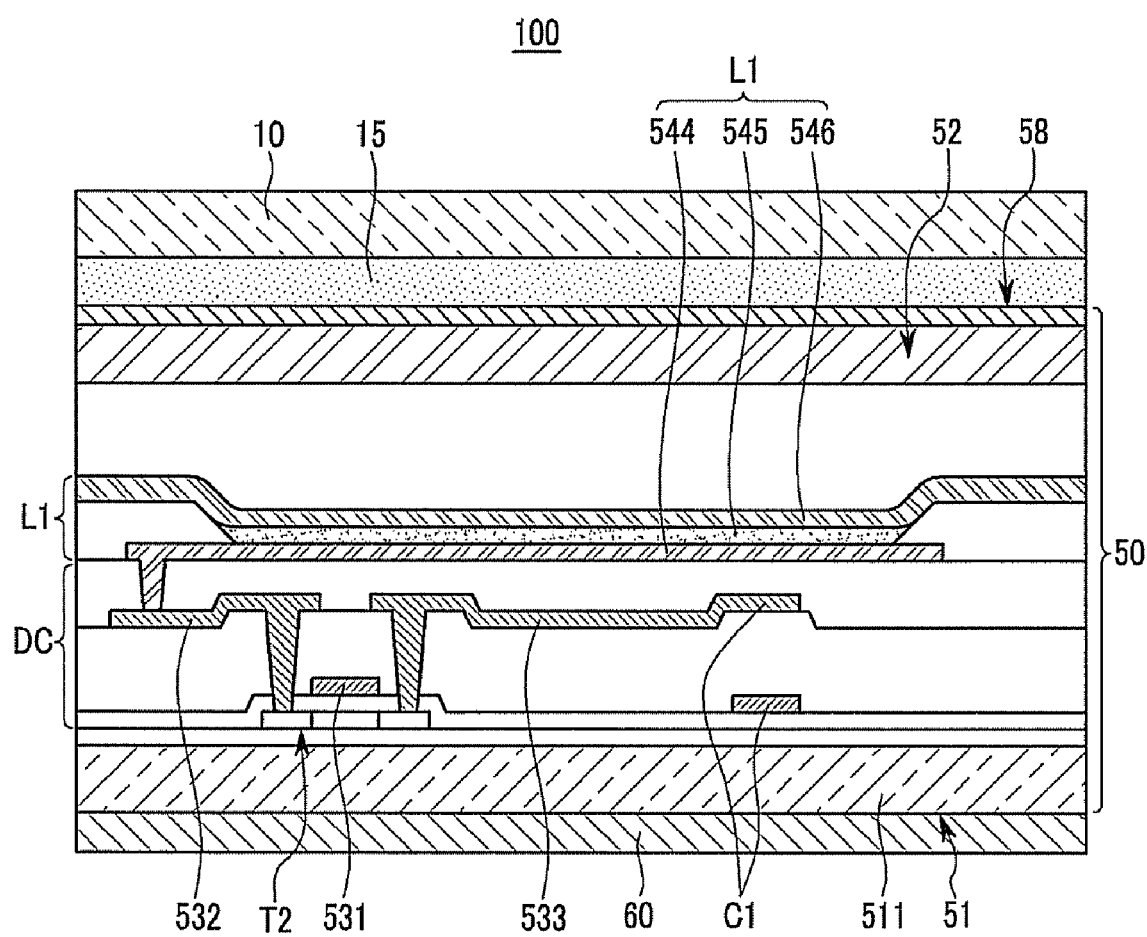
FIG. 3 is a partial-enlarged cross-sectional view of the OLED display of FIG. 1.

Hereinafter, a first exemplary embodiment of the present invention will be described with reference to FIG. 1 to FIG. 3. As shown in FIG. 1, an organic light emitting diode (OLED) display 100 includes a display panel 50, a cover window 10, an adhesive layer 15, and a guide frame 20. In addition, the OLED display 100 further includes a buffering member 60. Although it is not illustrated in the drawing, the OLED 100 may further include a printed circuit board (PCB) that supplies a driving signal to the display panel 50, and a flexible printed circuit board (FPCB) that connects the display panel 50 to the PCB.

The display panel 50 includes a first substrate 51 and a second substrate 52. The display panel 50 may further include a polarizing member 58 to suppress the reflection of external light. However, the present invention is not limited thereto, and the polarizing member 58 can be omitted. The second substrate 52 is generally smaller than the first substrate 51. The first substrate 51 and the second substrate 52 are bonded to each other by a sealant (not shown) disposed along an edge of the second substrate 52. The display panel 50 may further include an integrated circuit chip (not shown) that is mounted on an area of the first substrate 51 that does not overlap with the second substrate 52.

The first substrate 51 is divided in to a display area and a non-display area. The display area corresponds to the overlap between the first and second substrates 51, 52 and is where an image is displayed. The non-display area is an area other than the display area, where an image is not displayed.

The first substrate 51 includes a plurality of pixels (shown in FIG. 2 and FIG. 3) disposed in a matrix, in the display area. Each pixel is a primary unit that displays an image, and the OLED display 100 displays an image through a plurality of pixels. The first substrate 51 further includes a scan driver (not shown) and a data driver (not shown), formed in the display area or the non-display area, to drive the pixels. The first substrate 51 further includes a pad electrode (not shown) formed in the non-display area.

The integrated circuit chip (not shown) can be mounted on the first substrate 51, by a chip-on-glass (COG) method, so as to be electrically connected to the pad electrode (not shown). In addition, the first substrate 51 may further include wires (not shown) for connecting the mounted integrated circuit chip (not shown), the scan driver (not shown), and the data driver (not shown). The second substrate 52 is bonded to the first substrate 51 to protect the pixels, circuits, and wires formed in the first substrate 51 from the external environment.

The cover window 10 is disposed to face the second substrate 52 or the polarizing member 58, and entirely covers the display panel 50. In further detail, the cover window 10 covers one side of the display panel 50, from which an image is projected. The cover window 10 can be made of a transparent material, such as glass or plastic.

The guide frame 20 includes a flange 22 that is attached to the cover window 10, and a side wall 21 that extends from the flange 22 and faces edges of the display panel 50. The flange 22 can be bent from the sidewall 21, so as to form an approximately right angle.

The flange 22 is attached to one side of the cover window 10. The OLED display 100 may further include an adhesive member 25 interposed between the flange 22 and the cover window 10. An adhesive tape or various adhesives can be used as the adhesive member 25. That is, the flange 22 is adhered to one side of the cover window 10, by the adhesive member 25. However, the present invention is not limited thereto, and the flange 22 may be self-adhering, for example. The flange 22 extends from the side wall 21, and is disposed between the cover window 10 and the display panel 50.

The adhesive layer 15 is disposed in a space between the display panel 50, the cover window 10, and the flange 22. The side wall 21 surrounds the edges of the display panel 50. Since the side wall 21 faces the edges of the display panel 50, the assembling efficiency of the OLED display 100 can be improved. When the side wall 21 is not provided, the OLED display 100 may not be stably assembled, due to tolerances generated during the formation of the display panel 50.

The side wall 21 is spaced apart from the edges of the display panel 50. Therefore, damage to the display panel 50, which may occur when the guide frame 20 is deformed by an external impact into the display panel 50, can be suppressed.

The adhesive layer 15 connects the cover window 10 to the display panel 50. That is, the adhesive layer 15 attaches the cover window 10 to the display panel 50, by filling in the space between the cover window 10 and the display panel 50. As described, since opposing faces of the cover window 10 and the display panel 50 are directly connected by the adhesive layer 15, the overall strength and impact resistance of the OLED display 100 are improved.

The adhesive layer 15 has relatively high elasticity. That is, the adhesive layer 15 prevents the display panel 50 from being separated from the cover window 10. The relatively high elasticity of the adhesive layer 15 also protects the display panel 50 from external impacts, such that mechanical strength and reliability of the OLED display 100 are increased.

The guide frame 20 may optionally be combined to the display panel 50, by the adhesive layer 15. The guide frame 20 may be used to confine the adhesive layer 15 on a portion of the cover window, to help properly position the adhesive layer 15.

In particular, when the guide frame 20 is attached to the cover window 10, and the adhesive layer 15 is applied as a liquid to the cover window 10, the liquid adhesive layer 15 is confined to a particular portion of the cover window 10, by the guide frame 20. In addition, the liquid adhesive layer 15 is solidified, after display panel 50 is positioned thereon, so as to attach the cover window 10 to the display panel 50.

The adhesive layer 15 fills in the space between the cover window 10 and the display panel 50. Therefore, the adhesive layer 15 displaces any air from between the cover window 10 and display panel 50. Accordingly, an air interface does not reduce the transmittance of the OLED display 100, and the visibility of the OLED display 100 can thereby be improved. The adhesive layer 15 and the cover window 10 generally have similar refractive indexes. Therefore, a refractive index difference between the adhesive layer 15 and the cover window 10 can be minimized.

A refractive index of the adhesive layer 15 is more similar to that of the cover window 10 than to the refractive index of air. For example, the adhesive layer 15 may include an acryl-based resin that is hardened (cured) by ultraviolet (UV) light or heat. As described, reflection due to the refractive index difference can be efficiently reduced, by filling in the space between the display panel 50 and the cover window 10 with the adhesive layer 15.

The buffering member 60 is attached to a side of the display panel 50 that faces away from the cover window 10. The buffering member 60 is formed of a material that is less stiff than the display panel 50, in order to prevent the display panel 50 from being damaged by an impact. For example, the buffering member 60 may be made of a foamed rubber, or a foamed urethane obtained by fabricating a rubber solution in the form of a synthetic resin. The buffering member 60 can be omitted, according to some embodiments. With the above-described configuration, the visibility, impact resistance, and assembly efficiency of the OLED display 100 can be improved.

An internal structure of the OLED display 100 will now be described, with reference to FIG. 2 and FIG. 3. The display panel 50 displays an image with a plurality of pixels. As shown in FIG. 2 and FIG. 3, each pixel includes an OLED L1 and a driving circuit DC. The pixels are generally formed in the first substrate 51. That is, the first substrate 51 includes a substrate member 511, a driving circuit DC formed on the substrate member 511, and an OLED L1, for each pixel.

The OLED L1 includes an anode 544, an organic emission layer 545, and a cathode 546. The driving circuit DC includes two or more thin-film transistors (TFTs) T1 and T2, and at least one storage capacitor C1. The TFTs T1 and T2 include a switching transistor T1 and a driving transistor T2.

The switching transistor T1 is connected to a scan line SL1 and a data line DL1. The switching transistor T1 transmits a data voltage from the data line DL1 to the driving transistor T2, according to a switching voltage from the scan line SL1. The storage capacitor C1 is connected to the switching transistor T1 and a power source line VDD. The storage capacitor C1 stores a voltage difference between a voltage of the switching transistor T1 and a voltage of the power source line VDD.

The driving transistor T2 is connected to the power source line VDD and the storage capacitor C1. The driving transistor T2 supplies an output current $I_{OLED}$ that is proportional to the square of a voltage difference between a voltage stored in the storage capacitor C1 and a threshold voltage, to the OLED L1. The OLED L1 emits light according to the output current $I_{OLED}$. The driving transistor T2 includes a source electrode 533, a drain electrode 532, and a gate electrode 531. The anode electrode 544 of the OLED L1 may be connected to the drain electrode 532 of the driving transistor T2. The configuration of the pixels is not limited to the above-described example, and can be variously modified. The second substrate 52 covers the first substrate 51, in which the OLED L1 and the driving circuit DC are formed.

Figure 4:
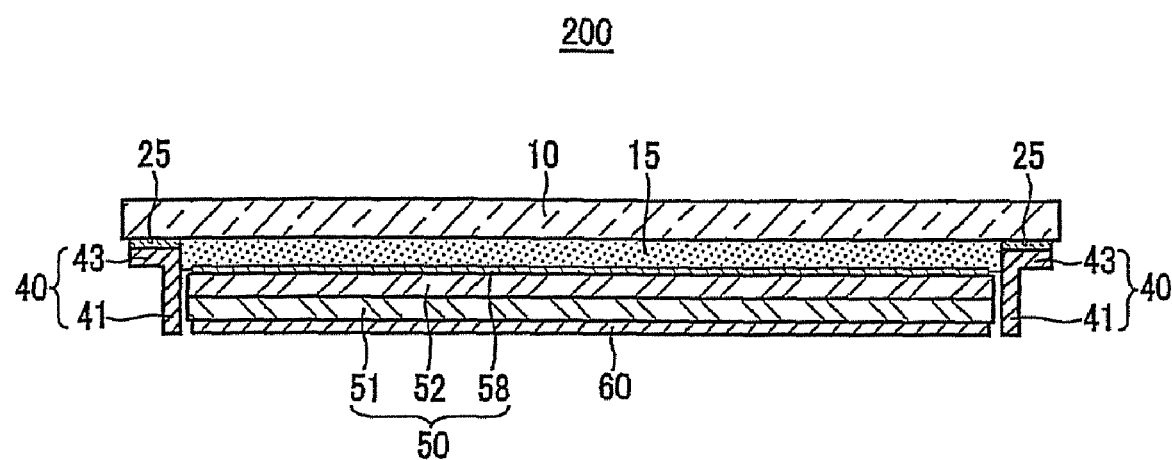
FIG. 4 is a cross-sectional view of an OLED display, according to a second exemplary embodiment of the present invention.

FIG. 4 illustrates an OLED display 200, according to a second exemplary embodiment of the present invention. As shown in FIG. 4, the OLED display 200 is similar to the OLED display 100 of FIG. 1, except the OLED display 200 has a different guide frame 40. Therefore, similar elements will not be described in detail. The guide frame 40 includes a side wall 41 and flange 43. However, the flange 43 extends from the side wall 41, away from a display panel 50.

By such a configuration, a collision of the guide frame 20 and a display panel 50 is even more unlikely. That is, the side wall 41 and the flange 43 can be prevented from contacting an edge of the display panel 50. In addition, a cover window 10 and the display panel 50 can be combined through an adhesive layer 15, disposed in a space therebetween. Therefore, the impact resistance of the OLED display 200 can be further improved.

Figure 5:
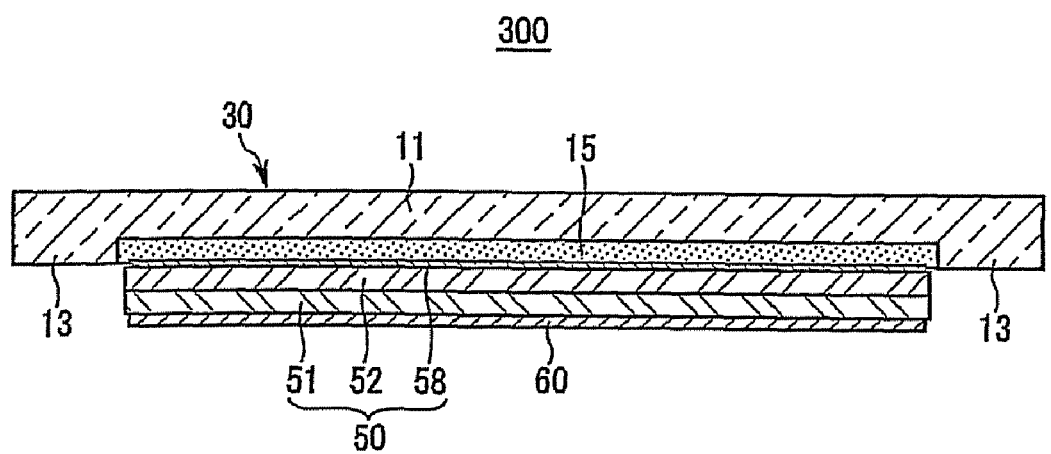
FIG. 5 is a cross-sectional view of an OLED display, according to a third exemplary embodiment of the present invention.

FIG. 5 illustrates an OLED display 200, according to a third exemplary embodiment of the present invention. As shown in FIG. 5, the OLED display 300 is similar to the OLED display 100 of FIG. 1, except that in the OLED display 300 includes a different cover window 30 that operates as a guide frame. Therefore, a separate guide frame is not included. That is, the cover window 30 includes a main body 11 and the guide frame portion 13. The guide frame portion 13 is thicker than, and surrounds, the main body 11. The guide frame portion 13 forms a space to receive an adhesive layer 15. The adhesive layer 15 attaches the cover window 30 to a display panel 50, while filling in a space therebetween.

In addition, the guide frame portion 13 is spaced apart from the display panel 50, so as to prevent damage to the display panel 50, as the result of an impact. With the above-described configuration, the structure of the OLED display 300 can be relatively simplified, and the visibility, impact resistance, and assembly efficiency of the OLED display 300 can be improved.

Figure 6:
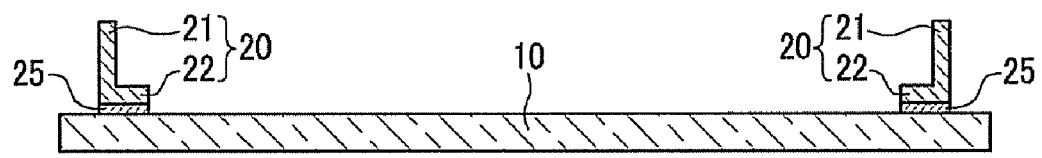
FIG. 6 to FIG. 8 are sequential cross-sectional views of a manufacturing method of the OLED display FIG. 1.
Figure 7:
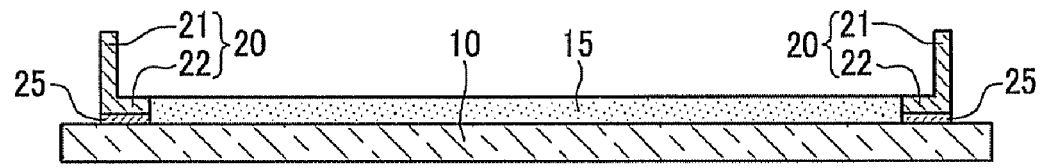

Hereinafter, a manufacturing method of the OLED display 100 of FIG. 1 will be described with reference to FIG. 6 to FIG. 8. First, as shown in FIG. 6, the guide frame 20 is attached to one side of the cover window 10, using the adhesive member 25. Next, as shown in FIG. 7, the adhesive layer 15 is coated on the cover window 10, inside of the guide frame 20. In this case, the adhesive layer 15 is in a liquid phase.

Figure 8:
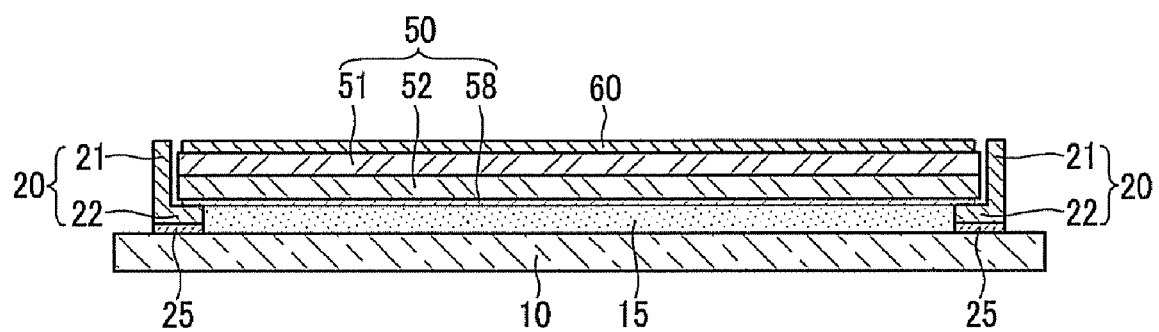

As shown in FIG. 8, the display panel 50 is disposed on the adhesive layer 15, and then the liquid adhesive layer 15 is solidified. The solidified adhesive layer 15 attaches opposing faces of the display panel 50 and the cover window 10. That is, the adhesive layer 15 fills in a space between the display panel 50 and the cover window. Here, the side wall 21 of the guide frame 20 is separated from the display panel 50.

The attached display panel 50 and the cover window 10 are turned over, and then the OLED display 100 of FIG. 1 is completed. With the above-described manufacturing method, the OLED display 100 having improved visibility, impact resistance, and assembly efficiency can be manufactured.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. An organic light emitting diode (OLED) display device, comprising:
   a cover window;
   a guide frame having a flange attached to the cover window with adhesive tape and having a side wall that extends from the flange and faces an edge of the display panel;
   an adhesive layer disposed on the cover window, within the guide frame;
   a display panel attached to the cover window, via the adhesive layer; and
   a buffering member disposed on a surface of the display panel that faces away from the adhesive layer, the side wall being spaced apart from the display panel with a space between the side wall and the display panel, and the buffering member having a surface that faces away from the display panel and is exposed to an exterior of the OLED display device.

2. The OLED display device of claim 1, wherein the adhesive layer is transparent, and an image is projected from the display panel, through the adhesive layer and the cover window, without passing though an air gap.

3. The OLED display device of claim 2, wherein the adhesive layer is coated as a liquid onto a portion of the cover window, and the guide frame confines the liquid to the portion of the cover window, and the liquid is solidified, such that the cover window is directly attached to the display panel.

4. The OLED display device of claim 1, wherein the flange is disposed between the cover window and the display panel.

5. The OLED display device of claim 1, wherein the flange is bent from the side wall, so as to extend away from the display panel.

6. The OLED display device of claim 1, wherein the side wall surrounds the display panel.

7. The OLED display device of claim 1, wherein the guide frame comprises a relatively thicker portion of the cover window that surrounds a main body of the cover window.

8. The OLED display device of claim 7, wherein the guide frame is spaced apart from the display panel.

9. A method for manufacturing an organic light emitting diode (OLED) display device, comprising:
attaching a guide frame to one side of a cover window;
coating an adhesive layer in liquid phase, on a portion of the cover window that is surrounded by the guide frame;
disposing a display panel on the adhesive layer;
solidifying the adhesive layer to attach the cover window to the display panel; and
disposing a buffering member on a surface of the display panel that faces away from the adhesive layer with a surface of the buffering member facing away from the display panel and exposed to an exterior of the OLED display device; and
attaching a flange of the guide frame to the cover window by adhesive tape with a side wall of the guide frame extending from the flange and facing an edge of the display panel, wherein the side wall is spaced apart from the display panel with a space between the side wall and the display panel.

10. The manufacturing method of claim 9, wherein the adhesive layer is transparent, and an image is projected from the display panel, through the adhesive layer and the cover window, without passing though an air gap.

11. The OLED display of claim 1, wherein the refractive index of the adhesive layer is closer to the refractive index of the cover window than to the refractive index of air.

* * * * *